United States Patent
Sone

Patent Number: 5,334,949
Date of Patent: Aug. 2, 1994

[54] DIFFERENTIAL AMPLIFIERS

[75] Inventor: Kazuya Sone, Tokyo, Japan

[73] Assignee: NEC Corporation, Japan

[21] Appl. No.: 21,301

[22] Filed: Feb. 23, 1993

[30] Foreign Application Priority Data

Feb. 27, 1992 [JP] Japan .................................. 4-041537
Mar. 4, 1992 [JP] Japan .................................. 4-046476

[51] Int. Cl.$^5$ ................................................ H03F 3/45
[52] U.S. Cl. ..................................... 330/253; 330/252; 330/257; 330/261
[58] Field of Search ............... 330/252, 253, 257, 261, 330/300

[56] References Cited

FOREIGN PATENT DOCUMENTS 2751289 5/1979 Fed. Rep. of Germany ...... 330/253
0272605 11/1987 Japan ................................. 330/253

OTHER PUBLICATIONS

Symetry in Audio Amplifier Circuitry Electronics & Wireless World, Jan. 1985.

*Primary Examiner*—William L. Sikes
*Assistant Examiner*—Fetsum Abraham
*Attorney, Agent, or Firm*—Laff, Whitesel, Conte & Saret

[57] ABSTRACT

A differential amplifier is disclosed which consists of two constant current sources $I_1$, $I_2$, one end of each of which is connected to a power supply terminal 4, a pair of differential transistors consisting of two FETs $M_1$, $M_2$, each of the gates of which is connected to singnal input terminals 1 and 2, respectively, and both the sources of which are connected to the other end of the current source $I_2$, a current-mirror circuit consisting of FETs $M_3$, $M_4$, wherein in the FET $M_3$ a connection point common to the gate and the drain is connected to the other end of the current source $I_2$ and the source is connected to a power supply terminal 5, and wherein in the FET $M_4$ the gate is connected to the connection point, the source is connected to power supply terminal 5, and the drain is connected to the drain of the FET $M_1$, and an FET $M_5$ wherein the gate is connected to the drain of the FET $M_4$, the source is connected to the power supply terminal 5, and the drain is connected to the drain of the FET $M_5$, wherein the difference between the voltages of two input signals inputted to the signal input terminals 1, 2 is amplified and outputted from the signal output terminal connected to the drain of the FET $M_5$, thereby an improved differential amplifier which has a large voltage gain, and is adaptable to a high-precision signal processing circuit can be provided.

14 Claims, 11 Drawing Sheets

DIFFERENTIAL AMPLIFIERS

FIELD OF THE INVENTION

This invention relates generally to a differential amplifier and, specifically, to the differential amplifier which provides a high gain in response to a low-frequency input signal.

DESCRIPTION OF THE PRIOR ART

A circuit shown in FIG. 1 is known as the prior-art differential amplifier of this sort. This circuit, as shown in the figure, consists of a pair of differential transistors comprising N-channel FETs (field effect transistor) $M_1$, $M_2$ wherein the sources are connected at a point common to them and the gates are connected to their respective input terminals 1, 2, a constant-current source $I_1$, one end of which is connected to the common connection point of the N-channel FET $M_1$, $M_2$, and the other end of which is connected to a low-voltage power supply terminal 4, and a current-mirror circuit comprising a P-channel FET $M_3$ wherein the drain and the gate are connected to the drain of the N-channel FET $M_1$ and the source is connected to a high-voltage power supply terminal 5 and a P-channel FET $M_4$ wherein the gate is connected to a connection point connecting the drain and the gate of the P-channel FET $M_3$, the source is connected to the high-voltage power supply terminal 5, and the drain is connected to both the drain of the N-channel FET $M_2$ and an output terminal 3.

In this constitution the pair of differential transistors consisting of the N-channel FETs $M_1$, $M_2$ divides the electric current of the constant current source $I_1$ in response to the ratio between signal voltages applied to their respective input terminals 1, 2 to generate respective drain currents. For example, if an equal voltage is applied to each of the input terminals 1, 2, an equal electric current flows through each of the FETs $M_1$, $M_2$. At this time, a voltage is also induced across the gate and source of the FET $M_3$ so that the same electric current flows through the P-channel FET $M_3$ of the current-mirror circuit. This voltage is also applied across the gate and the source of the P-channel FET $M_4$ so that the same current also flows through the FET $M_4$. That is, the circuit is stable in that the half of the electric current flowing through the constant-current source $I_1$ flows through each of all the FETs $M_1$, $M_2$, $M_3$, $M_4$.

In this stable state, if the change of the voltage applied to the input terminals 1, 2 causes the change of the drain current in the N-channel FET $M_1$, the amount of the change causes the current-mirror circuit consisting of the FETs $M_3$, $M_4$ to generate the amount of the change of the drain current in the FET $M_4$. On the other hand, the value of the amount of the change of the drain current in the N-channel FET $M_2$ is such that the amount of the change of the drain current in the N-channel FET $M_1$ is cancelled thereby. That is, if the drain current in the N-channel FET $M_1$ increases, the drain current in the N-channel FET $M_2$ decreases by that amount. Hence, the amount of the change of the electric current outputted from the output terminal 3 in response to the input voltage applied across the input terminals 1, 2 is the double of the amount of the change of the drain current in the N-channel FET $M_1$, $M_2$.

At this time, if the transconductance of the FETs $M_1$, $M_2$, $M_3$, $M_4$ in the balanced point is assumed to be gm and the output resistance of the FETs $M_2$ and $M_4$ are assumed to be $rn_2$ and $rp_4$, respectively, the low-frequency voltage gain Av of the differential amplifier shown in FIG. 1 is represented as follows:

$$Av = gm\{rn_2 rp_4/(rn_2 + rp_4)\}$$

For example, when $gm = 2 \times 10^{-3}$ (S, siemence), $rn_2 = 500k\Omega$, and $rp_4 = 200k\Omega$, the value of Av is calculated as follows:

$$Av = 2 \times 10^{-3} \times (1000/7) \times 10^3 = 286 \text{ times} = 49 \text{ dB}$$

That is, in this case, it can be said that the circuit shown in FIG. 1 has a low-frequency voltage gain of about 50 dB, and is a differential amplifier which amplifies the difference of voltages applied across the input terminals to output an amplified voltage.

However, the above-mentioned differential amplifier has some problems in that since the amplifier is unable to provide a large low-frequency voltage gain when it is used by applying negative feedback to its input terminal from its output terminal, an error in the gain of the output signal is generated so that it is not applicable to a high-precision circuit for processing signals.

SUMMARY OF INVENTION

An object of this invention is to provide a differential amplifier which solves foregoing and other problems. In one aspect the differential amplifier of this invention consists of a first constant-current source one end of which is connected to a first power supply terminal, a current-mirror circuit having a first and second transistors each of which has three electrodes wherein in the first transistor the first electrode is connected to a second power supply terminal, the second electrode is connected to the third electrode, and the connection point common to the second and the third electrodes is connected to the other end of the first constant-current source, and wherein in the second transistor the first electrode is connected to the second power supply terminal and the third electrode is connected to the common connection point, a second constant-current source one end of which is connected to the first power supply terminal, a pair of differential transistors consisting a third transistor and a fourth transistor each of which has three electrodes wherein in the third transistor the second electrode is connected to the second electrode of the second transistor and the third electrode is connected to a first signal input terminal, and wherein in the fourth transistor the first electrode is connected to the first electrode of the third transistor, the connection point common thereto is connected to the other end of the second constant-current source, and the third electrode is connected to a second signal input terminal, and a fifth transistor having three electrodes wherein the first electrode is connected to the second power supply terminal, the second electrode is connected to the second electrode of the fourth transistor, the connection point common thereto is connected to a signal output terminal, and the third electrode is connected to the second electrode of the second transistor.

The differential amplifier of this constitution is capable of generating a high-voltage gain that is 118 times larger than that obtained by a conventional amplifier in response to low-frequency input signals. Thus, the error of gain in the output signal, which was inevitable to the prior-art circuit when it was used by applying feedback, is reduced so that a differential amplifier that is applicable to a high-precision signal-processing circuit can be provided.

In this case, each of the above-mentioned first and second constant-current sources can be constituted by an FET wherein the gate is connected to the bias voltage terminal, the source serves as the one end, and the drain serves as the other end. Alternatively, it may also be constituted by a bipolar transistor wherein the base is connected to the bias votltage terminal, a resistor connected to the emitter serves as the one end, and the collector serves as the other end.

Further, the first to fifth transistors can be provided by using FETs each of which equipped with source, drain, and gate electrodes which serve as the first, the second, and the third electrodes, respectively.

In another aspect the differential amplifier of this invention consists of a first constant-current source one end of which is connected to a first power supply terminal, a current-mirror circuit having a first and second transistors each of which has three electrodes wherein in the first transistor the first electrode is connected to a second power supply terminal, the second electrode is connected to the third electrode, and the connection point common to the second and the third electrodes is connected to the other end of the first constant-current source, and wherein in the second transistor the first electrode is connected to the second power supply terminal and the third electrode is connected to the common connection point, a second constant-current source one end of which is connected to the first power supply terminal, a pair of differential transistors consisting of a third transistor and a fourth transistor each of which has three electrodes wherein in the third transistor the third electrode is connected to a first signal input terminal, and wherein in the fourth transistor the first electrode is connected to the first electrode of the third transistor, the connection point common thereto is connected to the other end of the second constant-current source, and the third electrode is connected to a second signal input terminal, a fifth transistor having three electrodes wherein the first electrode is connected to the second electrode of the third transistor, the second electrode is connected to the second electrode of the second transistor, and the third electrode is connected to a bias voltage terminal, a sixth transistor having three electrodes wherein the first electrode is connected to the second electrode of the fourth transistor and the third electrode is connected to the bias voltage terminal, and a seventh transistor having three electrodes wherein the first electrode is connected to the second power source terminal, the second electrode is connected to the second electrode of the sixth transistor, the connection point common thereto is connected to a singnal output terminal, and the third electrode is connected to the second electrode of the second transistor.

The differential amplifier of this constitution is capable of generating a high-voltage gain that is larger by more than 188 times than that obtained by a conventional amplifier in response to low-frequency input signals. Thus, the error of gain in the output signal, which was inevitable to the prior-art circuit when it was used by applying feedback, is reduced so that a differential amplifier that is applicable to a high-precision signal-processing circuit can be provided, and so that the deterioration of frequency characteristics caused by the miller capacitance of the input terminal part can also be remarkably improved.

In this differential amplifier, similarly to the above-mentioned case, each of the above-mentioned first and second constant-current sources can also be constituted by an FET wherein the gate is connected to the bias voltage terminal, the source serves as the one end, and the drain serves as the other end. Alternatively, it may also be constituted by a bipolar transistor wherein the base is connected to the bias voltltage terminal, a resistor connected to the emitter serves as the one end, and the collector serves as the other end.

Further, the first to seventh transistors can be provided by using FETs each of which equipped with source, drain, and gate electrodes which serve as the first, second, and third electrodes, respectively.

DESCRIPTION OF THE PREFERRED EMBODIMENT

Figure 1:
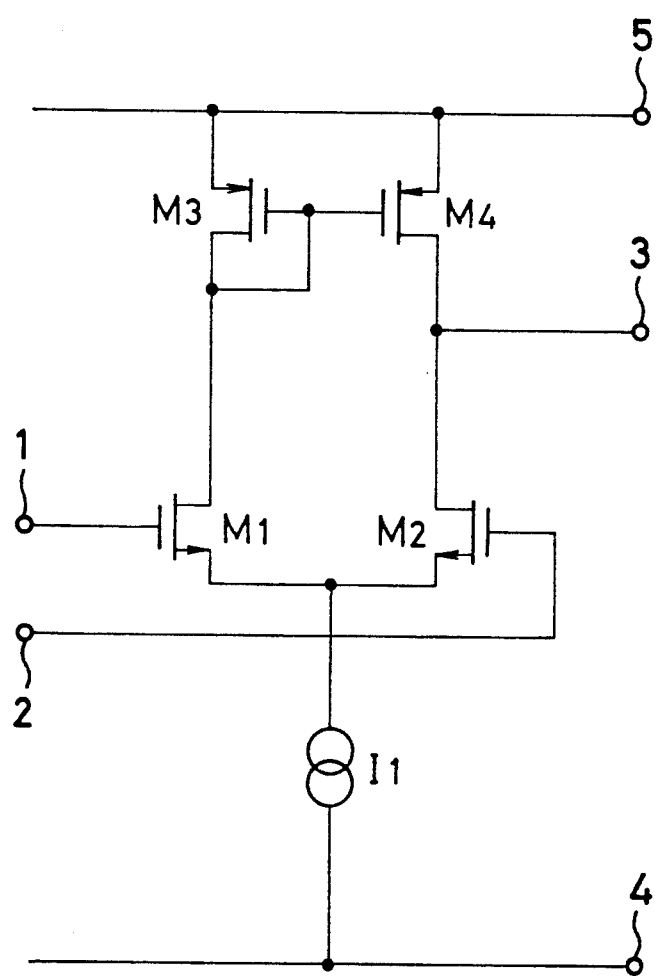
FIG. 1 is a schematic showing a prior-art differential amplifier consisting of one constant-current source, two FETs for dividing electric currents in response to the difference of voltages, and two FETs for constituting a corrent-mirror circuit.
Figure 2:
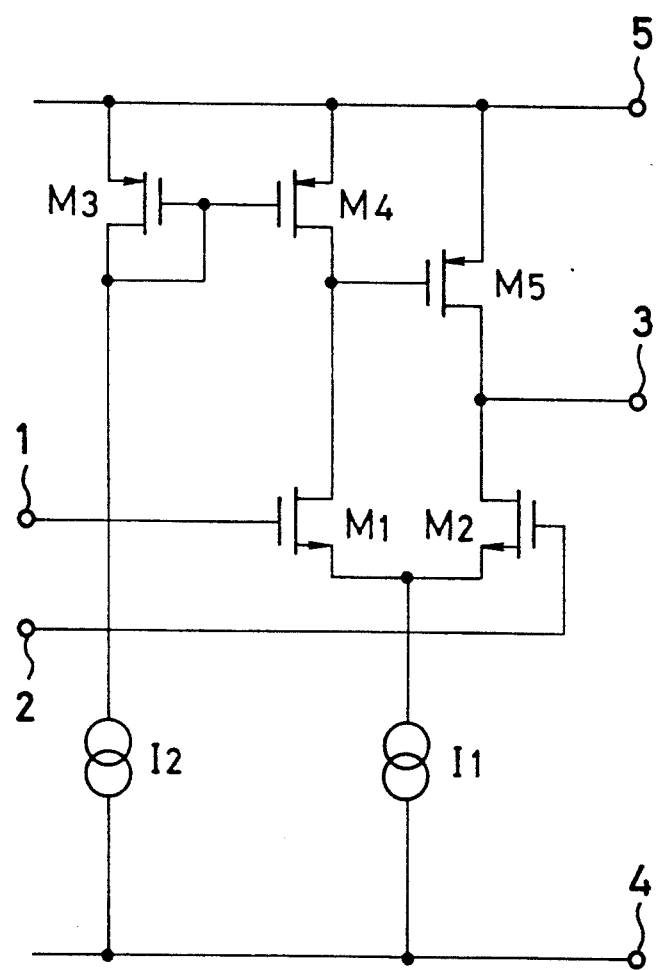
FIG. 2 is a schematic showing the first embodiment of the differential amplifier of this invention consisting of one further constant-current source and one FET in addition to the circuit shown in FIG. 1.

FIG. 2 shows the first embodiment of the differential amplifier of this invention. It consists of a pair of differential transistors comprising N-channel FETs (field effect transistor) $M_1$, $M_2$ wherein the sourses are connected to a point common thereto and the gates are connected to their respective input terminals 1, 2, a constant-current source $I_1$, one end of which is connected to the common connection point of the N-channel FET $M_1$, $M_2$, and the other end of which is connected to a first power supply terminal (in this case a low-voltage power supply terminal) 4, a current-mirror circuit comprising a P-channel FET $M_3$ wherein the drain is connected to the gate and the source is connected to a second power supply terminal (in this case a high-voltage power supply terminal) 5, and conprising a P-channel FET $M_4$ wherein the gate is connected to a connection point common to the drain and the gate of the P-channel FET $M_3$, the source is connected to the high-voltage power supply terminal 5, and the drain is connected to the drain of the N-channel FET $M_1$, a P-channel FET $M_5$ wherein the gate is connected to a connection point common to the drains of the N-channel FET $M_1$ and the P-channel FET $M_4$, the source is connected to the high-voltage power supply terminal 5, and the drain is connected to both an output terminal 3 and the drain of the N-channel FET $M_2$, and a constant-current source $I_2$, one end of which is connected to the connection point common to the drain and the gate of the P-channel FET $M_3$, and the other end of which is connected to the low-voltage power supply terminal 4.

In this constitution the pair of differential transistors consisting of the N-channel FET $M_1$, $M_2$ divides the electric current of the constant current source $I_1$ in response to the ratio between signal voltages applied to the first and second input terminals 1, 2 to generate respective drain currents. The output of the current-mirror circuit consisting of the P-channel FETs $M_3$, $M_4$ becomes constant and equals to the value of electric current defined by the constant-current source $I_2$, as stated above. Hence, the circuit maintains a stable state by appropriately setting both the value of the electric current flowing through the constant-current sources $I_1$, $I_2$ and the value of voltages applied to the input terminals. For example, if the value of the electric current flowing through the constant-current source $I_2$ is set at the half of that of the electric current flowing through the constant-current source $I_1$, and if the same value of voltages is applied to each of the input terminals 1, 2, the circuit is stabilized in that the value of the electric current flowing through each of all the FETs $M_1$, $M_2$, $M_3$, $M_4$, and $M_5$ equals that of the electric current flowing through the constant-current source $I_2$.

In this stable state, if the change of the voltage applied to the input terminals 1, 2 causes the change of the drain current in the N-channel FET $M_1$, the resultant amount of the change is transmitted to the gate of the P-channel FET $M_5$. As a result, the amount of the change of the drain current in the N-channel FET $M_1$ is amplified by the P-channel FET $M_5$, and outputted from the signal output terminal 3. On the other hand, the value of the amount of the change of the drain current in the N-channel FET $M_2$ is such that the amount of the change of the drain current in the N-channel FET $M_1$ is cancelled thereby. That is, if the drain current in the N-channel FET $M_1$ increases, the drain current in the N-channel FET $M_2$ decreases by that amount. Hence, the amount of the change of the electric current outputted from the output terminal 3 in response to the change of the input voltage applied across the input terminals 1, 2 is greatly improved in that the amplification factor of the P-channel FET $M_5$ is added to the amplification factor, which is due to the amount of the change of the drain current in the conventional N-channel FET $M_1$, $M_2$.

For example, if the transconductance of the N-channel FETs $M_1$ and $M_2$ and the P-channel FET $M_5$ are assumed to be $gm_1$, $gm_2$, and $gm_5$, respectively, the output resistance of the N-channel FETs $M_1$ and $M_2$ and the P-channel FETs $M_4$ and $M_5$ are assumed to be $ro_1$ and $ro_2$ and $ro_4$ and $ro_5$, respectively, and the input resistance of the P-channel FET $M_5$ is assumed to be $ri_5$, the low-frequency voltage gain Av of the differential amplifier shown in FIG. 2 is represented as follows:

$$Av = (\tfrac{1}{2})gm_1\{ro_1 ro_4 ri_5/(ro_1 ro_4 + ro_4 ri_5 + ri_5 ro_1)\}gm_5\{ro_2 ro_5/(ro_2+ro_5)\} + (\tfrac{1}{2})gm_2\{ro_2 ro_5/(ro_2+ro_5)\}$$

Thus, the value of the low-frequency voltage gain can be increased by about $$(\tfrac{1}{2})[gm_1\{ro_1 ro_4 ri_5/(ro_1 ro_4 + ro_4 ri_5 + ri_5 ro_1)\} + 1]$$
times.

For example, when $gm_2 = gm_5 = gm$, $ro_2 = rn_2$, $ro_5 = rp_4$, $gm_1 = 4 \times 10^{-3}$ S, $ro_1 = 500$ kΩ, $ro_4 = 200$ kΩ, $ri_5 = 100$ kΩ, the value of Av is calculated as follows:

$$Av = 118 \times gm\{rn_2 rp_4/(rn_2+rp_4)\}$$

This means that the low-frequency Av increases by about 118 times, namely, by about 41 dB.

Thus, since in the embodiment a low-frequency voltage gain of about 100 dB or more can be obtained so that the error in gain of the output signal can be reduced when negative feedback is applied, a differential amplifier that is applicable to a high-precision signal processing circuit can be provided.

Figure 3:
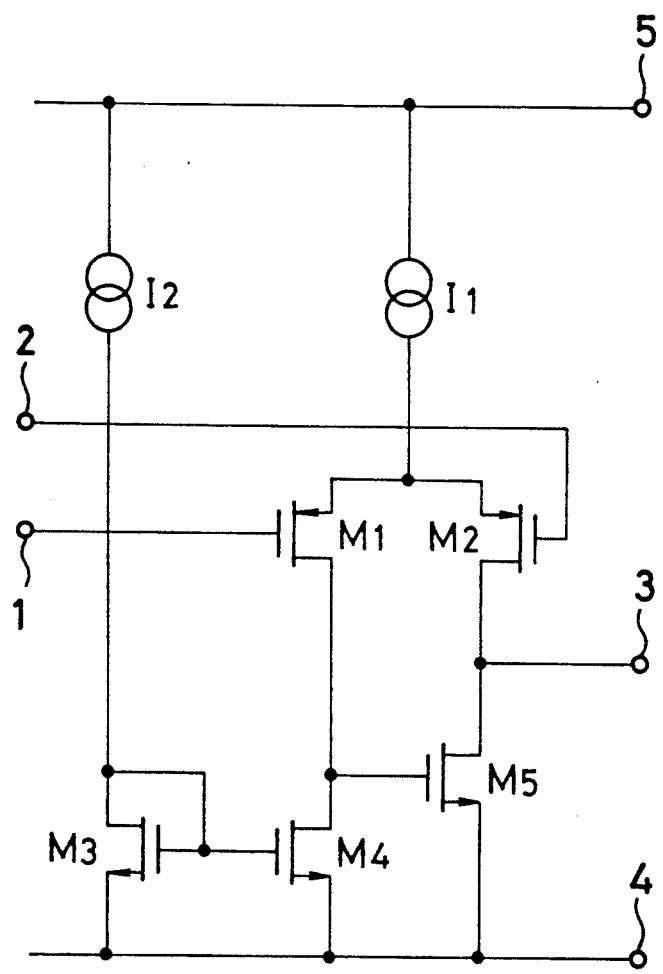
FIG. 3 is a schematic showing the second embodiment of the differential amplifier of this invention, wherein the polarity of each of the elements shown in FIG. 2 is changed.

FIG. 3 shows a schematic of the second embodiment of the differential amplifier of this invention. In this diagram the same marks as the first embodiment shown in FIG. 2 show like parts or equivalents. The second embodiment differs from the first embodiment in that the N-channel FETs for $M_1$ and $M_2$ are replaced by P-channel FETs, the P-channel FETs for $M_3$, $M_4$, and $M_5$ are replaced by N-channel FETs, and the polarities of the constant-current sources $I_1$ and $I_2$ are reversed as against the first embodiment.

The fundamental operation of this embodiment as a differential amplifier is similar to that of the first embodiment since only the polarity of the circuit is reversed. Hence, we will omit explaining this embodiment in detail. As, in general, the noise of P-channel transistors is smaller than that of N-channel transistors, the use of P-channel FETs as a pair of differential transistors in the signal input part of this embodiment makes it possible to further improve the overall noise characteristics of the differential amplifier as compared with the first embodiment.

Figure 4:
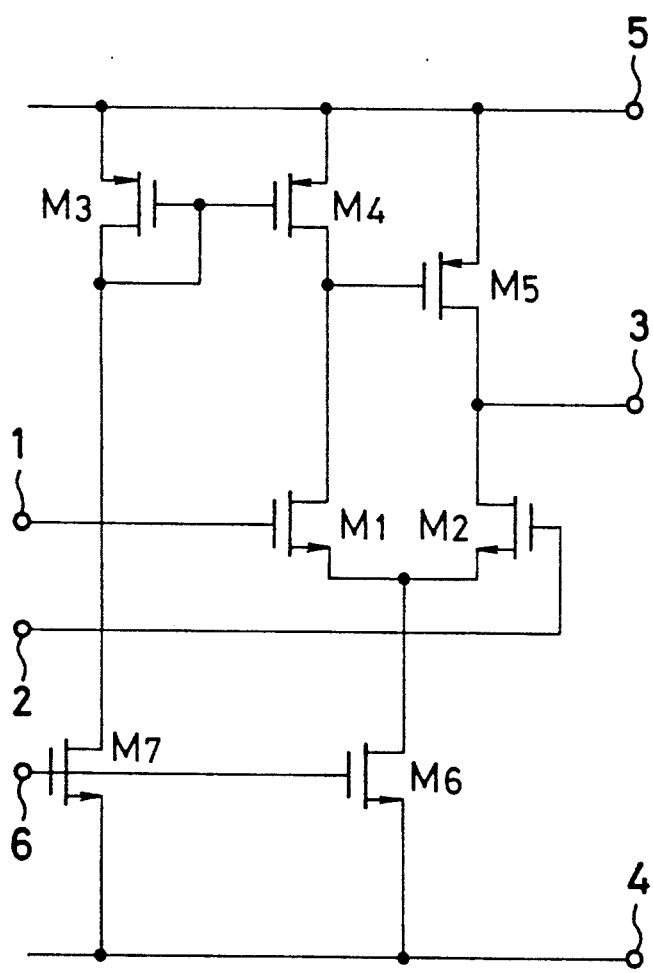
FIG. 4 is a schematic showing the third embodiment of the differential amplifier of this invention, wherein two FETs are used instead of the two constant-current sources shown in FIG. 1.

FIG. 4 shows a schematic of the third embodiment of the differential amplifier of this invention. In this diagram the same marks as the first embodiment shown in FIG. 2 show like parts or equivalents. It differs from the first embodiment in that the constant-current sources $I_1$ and $I_2$ are constituted by using N-channel FETs $M_6$ and $M_7$ wherein the gates are connected to a bias voltage terminal.

In this constitution N-channel FETs $M_6$ and $M_7$ operate as constant-current sources. Hence, since the fundamental operation of the thus constituted embodiment as a differential amplifier is similar to that of the first embodiment, we will omit explaining this embodiment in detail. If the ratio of the channel width of the gate of the N-channel FET M6 to its channel length is the double of that of the N-channel FET M7 or if the N-channel FET M6 is constituted by using two transistors that are the same as the N-channel FET M7 connected in parallel, the value of the constant-current source $I_1$ is the double of that of the constant-current source $I_2$ so that the drain current flowing through each of the N-channel FETs $M_1$ and $M_2$ can be made equal under the state in which the same voltage is applied to each of the input terminals 1 and 2. As a result, the off-set voltage of differential amplifiers can be eliminated.

Figure 5:
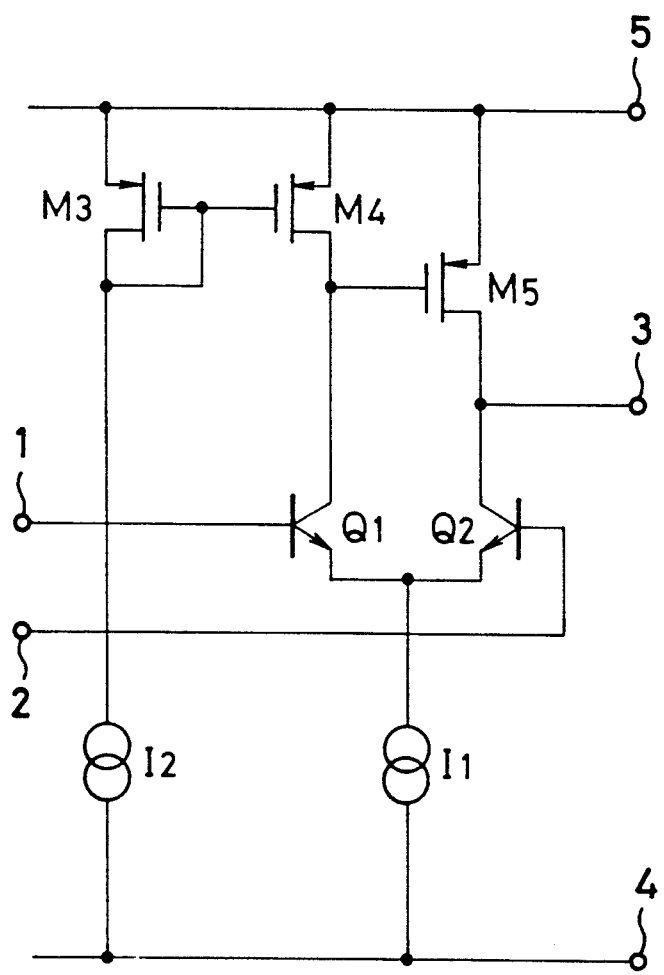
FIG. 5 is a schematic showing the fourth embodiment of the differential amplifier of this invention, wherein two bipolar transistors are used instead of the two FETs to constitute the current dividing circuit shown in FIG. 1.

FIG. 5 shows a schematic of the fourth embodiment of the differential amplifier of this invention. In this diagram the same marks as the first embodiment shown in FIG. 2 show like parts or equivalents. It differs from the first embodiment in that the pair of differential transistors are constituted by using NPN bipolar transistors $Q_1$, $Q_2$ instead of the N-channel FETs $M_1$, $M_2$. In this constitution there is no difference in the function of a pair of differential transistors between FET and bipolar transistors. Hence, since the fundamental operation of the thus constituted embodiment as a differential amplifier is similar to that of the first embodiment, we will omit explaining this embodiment in detail. If the transconductance of each of the NPN bipolar transistors $Q_1$ and $Q_2$ is assumed to be $Gm_1$ and $Gm_2$, respectively, and the output resistance of each of the transistors $Q_1$ and $Q_2$ is assumed to be $Ro_1$ and $Ro_2$, respectively, the low-frequency voltage gain Av of the circuit is represented as follows:

$$Av = (\tfrac{1}{2})Gm_1\{Ro_1 ro_4 ri_5/(Ro_1 ro_4 + ro_4 ri_5 + ri_5 \cdot Ro_1)\}Gm_5\{Ro_2 ro_5/(Ro_2+ro_5)\} + (\tfrac{1}{2})Gm_2\{Ro_2 ro_5/(Ro_2+ro_5)\}$$

Thus, the effect of improvement in the voltage gain of the circuit can be obtained in the same manner as the first embodiment.

Figure 6:
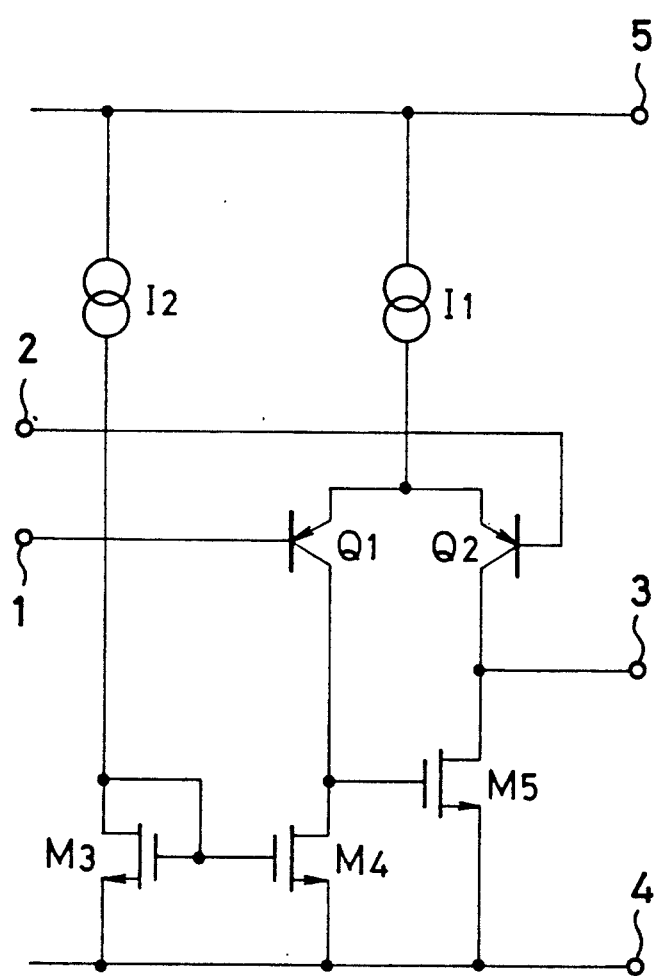
FIG. 6 is a schematic showing the fifth embodiment of the differential amplifier of this invention, wherein the polarity of each of the elements shown in FIG. 5 is changed.

FIG. 6 shows a schematic of the fifth embodiment of the differential amplifier of this invention. In this diagram the same marks as the fourth embodiment shown in FIG. 5 show like parts or equivalents. It differs from the fourth embodiment in that the NPN bipolar transistors for $Q_1$ and $Q_2$ are replaced by PNP bipolar transistors, the P-channel FETs for $M_3$, $M_4$, and $M_5$ are replaced by N-channel FETs, and the polarities of the constant-current sources $I_1$ and $I_2$ are reversed.

The fundamental operation of this embodiment as a differential amplifier is similar to that of the fourth embodiment since only the polarity of the circuit is reversed. Hence, we will omit explaining this embodiment in detail. As, in general, the noise of PNP transistors is smaller than that of NPN transistors, the use of PNP bipolar transistors $Q_1$, $Q_2$ as a pair of differential transistors in the singnal input part of this embodiment makes it possible to further improve the overall noise characteristics of the differential amplifier as compared with the fourth embodiment.

Figure 7:
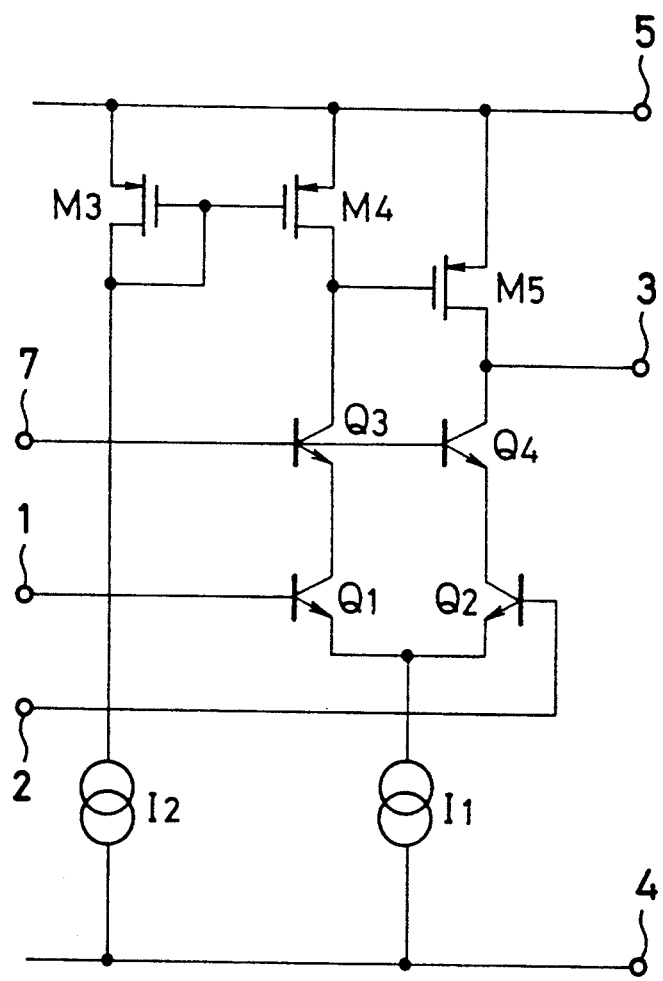
FIG. 7 is a schematic showing the sixth embodiment of the differential amplifier of this invention, wherein four bipolar transistors are used by further adding two bipolar transistors to the current dividing circuit shown FIG. 5.

FIG. 7 shows a schematic of the sixth embodiment of the differential amplifier of this invention. In this diagram the same marks as the fourth embodiment shown in FIG. 5 show like parts or equivalents. It differs from the fourth embodiment in that the collectors and the emitters of NPN bipolar transistors $Q_3$ and $Q_4$ are connected between the drains of the P-channel FETs $M_4$ and $M_5$ and the collectors of the NPN bipolar transistors $Q_1$ and $Q_2$, respectively, and the output terminal 3 is connected to a connection point common to the drain of the P-channel FET $M_5$ and the collector of the transistor $Q_4$.

Although the fundamental operation of this embodiment as a differential amplifier is similar to that of the fourth embodiment, we will explain it in brief. The pair of transistors consisting of NPN bipolar transistors $Q_1$, $Q_2$ divides the electric current of the constant-current source $I_1$ in response to the ratio between signal voltages applied to each of the input terminals 1, 2 to cause collector currents to flow. As both the bases of the NPN bipolar transistors $Q_3$ and $Q_4$ are connected to a bias voltage terminal 7, they operate as grounded base transistors. Hence, the emitter currents of the NPN bipolar transistors $Q_3$ and $Q_4$ equal the collector, currents of the NPN bipolar transistors $Q_1$ and $Q_2$. Since the output current from the current-mirror circuit consisting of P-channel FETs $M_3$, $M_4$ equals the constant value of electric current which is always defined by the constant-current source $I_2$, the change of the input voltage from the balanced stable state, in which steady currents flow through the circuit, causes to generate an amount of the change of the collector current in the NPN bipolar transistors $Q_1$. The amount of the change is transmitted to the gate of the P-channel FET $M_5$ and amplified by it to be outputted from the output terminal 3. On the other hand, the amount of the change of the collector current in the bipolar transistor $Q_2$ takes the value such that the amount of the change of the collector current in the bipolar transistor $Q_1$ is cancelled thereby. As a result, a large voltage gain similar to the above-mentioned embodiment can be obtained.

If the transconductance of the NPN bipolar transistors $Q_1$, $Q_2$, $Q_3$, and $Q_4$ and the P-channel FET $M_5$ are assumed to be $gm_1$, $gm_2$, $gm_3$, $gm_4$, and $gm_5$, respectively, the output resistance of the P-channel FETs $M_4$ and $M_5$ are assumed to be $ro_4$ and $ro_5$, respectively, and the input resistance of the P-channel FET $M_5$ is assumed to be $ri_5$, the low-frequency voltage gain Av of this differential amplifier is represented as follows:

$$Av = (\tfrac{1}{2})gm_1(1/gm_3)gm_3\{(ro_4+ri_5)/(ro_4+ri_5)\}gm_5 ro_5 + \\ (\tfrac{1}{2})gm_2 \\ (1/gm_4)gm_4 ro_5 = \{(\tfrac{1}{2})ro_5\}[\{gm_1 ro_4 ri_5/(ro_4+ri_5)\}gm_5 + gm_2[$$

For example, when $gm_1 = gm_2 = 4\times 10^{-3}$S, $gm_5 = 2\times 10^{-3}$S, $ro_4 = 200$ kΩ, $ro_5 = 200$ kΩ, and $ri_5 = 100$ kΩ, it is calculated as follows:

$$Av = (\tfrac{1}{2})\times 200\times 10^3 \times (2\times 10^{-3}\times 4\times 200\times 100/300 + 4\times 10^{-3}) = 53733 \text{ times} = 95 \text{ dB}.$$

Thus, a differential amplifier whose voltage gain is 188 time, namely, about 45 dB larger than the conventional one can be provided.

Further, as in this embodiment the grounded base transistors $Q_3$ and $Q_4$ are added to the pair of differential transistors $Q_1$, $Q_2$, frequency characteristics relative to miller capacitance of the input part can be improved compared to the above-mentioned embodiment. That is, in the embodiment the miller capacitance of the input part was $(1+Av)C$ ($C$ is the capacitance of the transistors in the input part). In contrast, this embodiment has a great effect in that the miller capacitance can be 2C so that the deterioration of frequency characteristics caused by the capacitance can be greatly improved.

Figure 8:
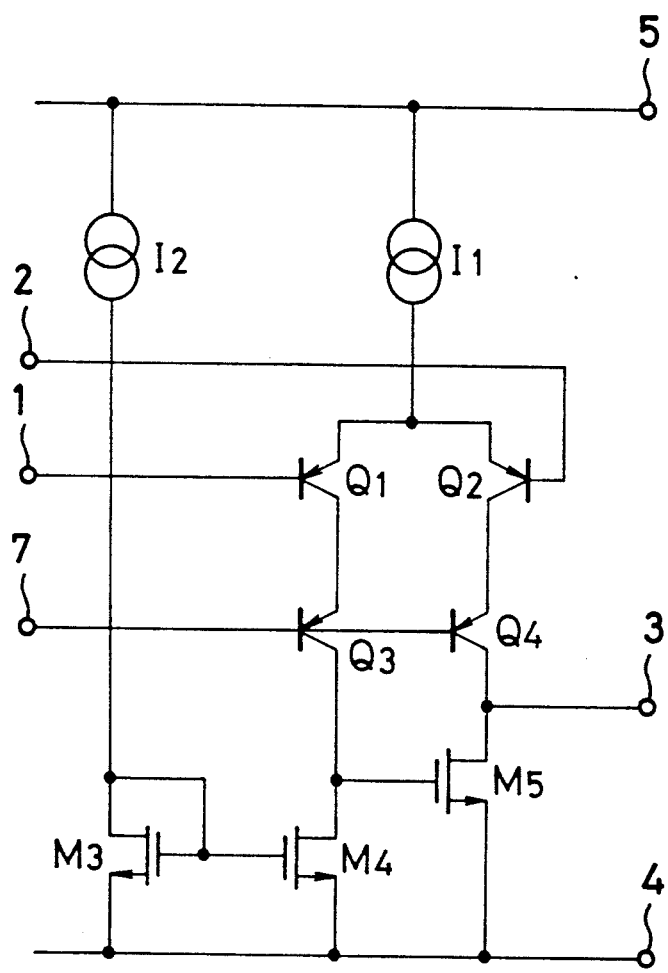
FIG. 8 is a schematic showing the seventh embodiment of the differential amplifier of this invention, wherein the polarity of each of the elements shown in FIG. 7 is changed.

FIG. 8 shows a schematic of the seventh embodiment of the differential amplifier of this invention. In this diagram the same marks as the sixth embodiment shown in FIG. 7 show like parts or equivalents. It differs from the sixth embodiment in that in this embodiment the polarities of the bipolar transistors $Q_1$–$Q_4$, the FETs $M_3$–$M_5$, and the constant-current sources $I_1$, $I_2$ of the sixth embodiment are reversed.

The fundamental operation of this embodiment as a differential amplifier is similar to that of the sixth embodiment since only the polarity of the circuit is reversed. Hence, we will omit explaining this embodiment in detail. As PNP transistors are used in the input signal part of this embodiment, it is possible, similarly to the above-mentioned fifth embodiment, to further improve the overall noise characteristics of the differetial amplifier as compared with the sixth embodiment.

Figure 9:
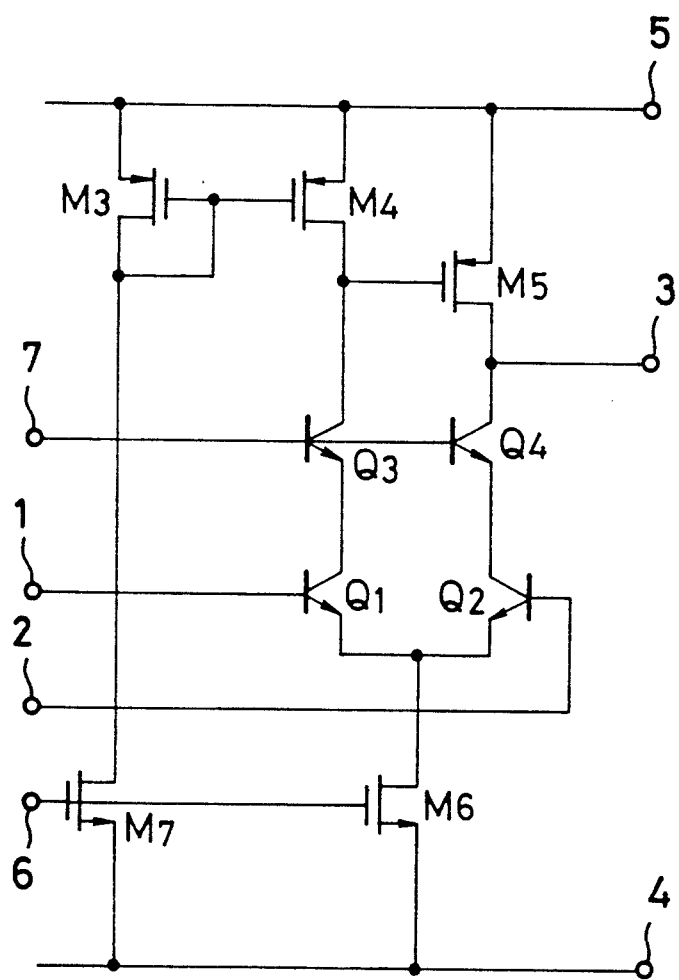
FIG. 9 is a schematic showing the eighth embodiment of the differential amplifier of this invention, wherein two FETs are used instead of the two constant-current sources shown in FIG. 7.

FIG. 9 shows a schematic of the eighth embodiment of the differential amplifier of this invention. In this diagram the same marks as the sixth embodiment shown in FIG. 7 show like parts or equivalents. It differs from the sixth embodiment in that the constant-current sources $I_1$ and $I_2$ are constituted by using N-channel FETs $M_6$ and $M_7$ wherein the gates are connected to a bias voltage terminal.

In this constitution N-channel FETs $M_6$ and $M_7$ operate as constant-current sources. Hence, since the fundamental operation of the thus constituted embodiment as a differential amplifier is similar to that of the first embodiment, we will omit explaining this embodiment in detail. If the ratio of the channel width of the gate of the N-channel FET $M_6$ to its channel length is the double of that of the N-channel FET $M_7$ or if the N-channel FET $M_6$ is constituted by using two transistors that are the same as the N-channel FET $M_7$ connected in parallel, the collector current flowing through each of the bipolar transistors $Q_1$ and $Q_2$ can be made equal. As a result, the intrinsic off-set voltage of differential amplifiers can be eliminated.

In this case, it is a matter of course that the constant-current sources $I_1$ and $I_2$ can be constituted by using bipolar transistors or bipolar transistors and resistors to obtain a similar effect.

Figure 10:
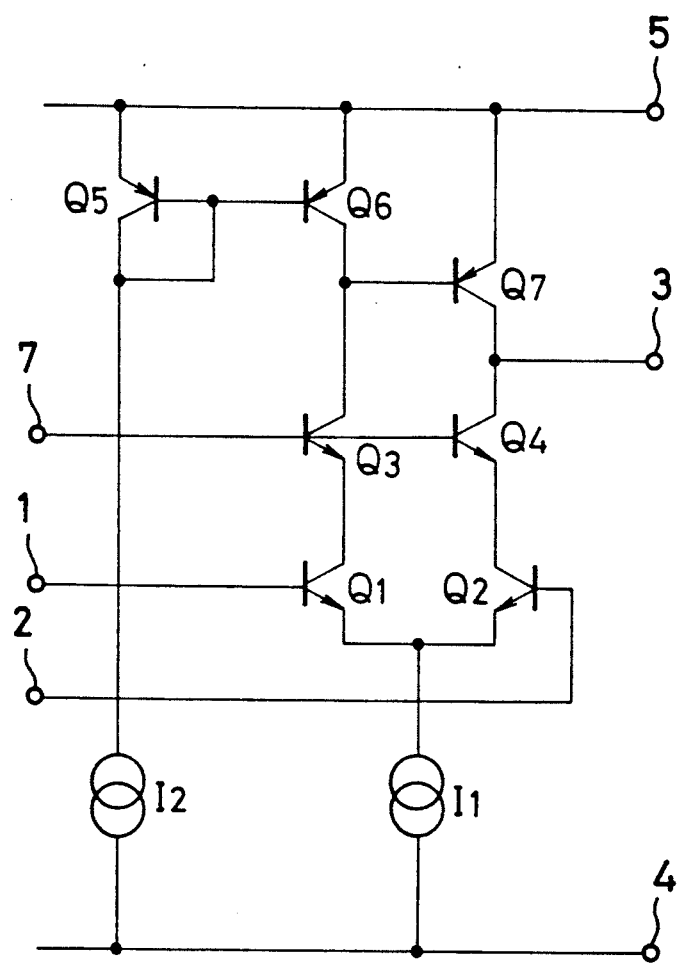
FIG. 10 is a schematic showing the ninth embodiment of the differential amplifier of this invention, wherein all the three FETs shown in FIG. 7 are replaced by bipolar transistors.

FIG. 10 shows a schematic of the ninth embodiment of the differential amplifier of this invention. In this diagram the same marks as the sixth embodiment shown in FIG. 7 show like parts or equivalents. It differs from the sixth embodiment in that a current-mirror circuit is constituted by using bipolar transistors $Q_5$–$Q_7$ instead of the P-channel FETs $M_3$–$M_5$.

Since in this constitution the operation of the embodiment as a differential amplifier is similar to that of the sixth embodiment, we will omit explaining this embodiment in detail. If the transconductance of the bipolar transistors $Q_1$, $Q_2$, $Q_3$, $Q_4$, and $Q_7$ are assumed to be $gm_1$, $gm_2$, $gm_3$, $gm_4$, and $gm_7$, respectively, the output resistance of the bipolar transistors $Q_6$ and $Q_7$ are assumed to be $ro_6$ and $ro_7$, respectively, and the input resistance of the bipolar transistor $Q_7$ is assumed to be $ri_7$, the low-frequency voltage gain Av is represented as follows:

$$Av = (\tfrac{1}{2})gm_1(1/gm_3)gm_3\{(ro_6 ri_7)/(ro_6 + ri_7)\}gm_7 ro_7 + (\tfrac{1}{2})gm_2(1/gm_4)gm_4 ro_7 = \{(\tfrac{1}{2})ro_7\}[\{gm_1 ro_6 ri_7/(ro_6 + ri_7)\}gm_7 + gm_2]$$

Thus, a large voltage gain similar to that of the sixth embodiment can be obtained. Further, regarding the effect of the improvement in frequency characteristics due to the addition of the grounded base transistors $Q_3$, $Q_4$, an effect similar to the sixth embodiment can be obtained.

Figure 11:
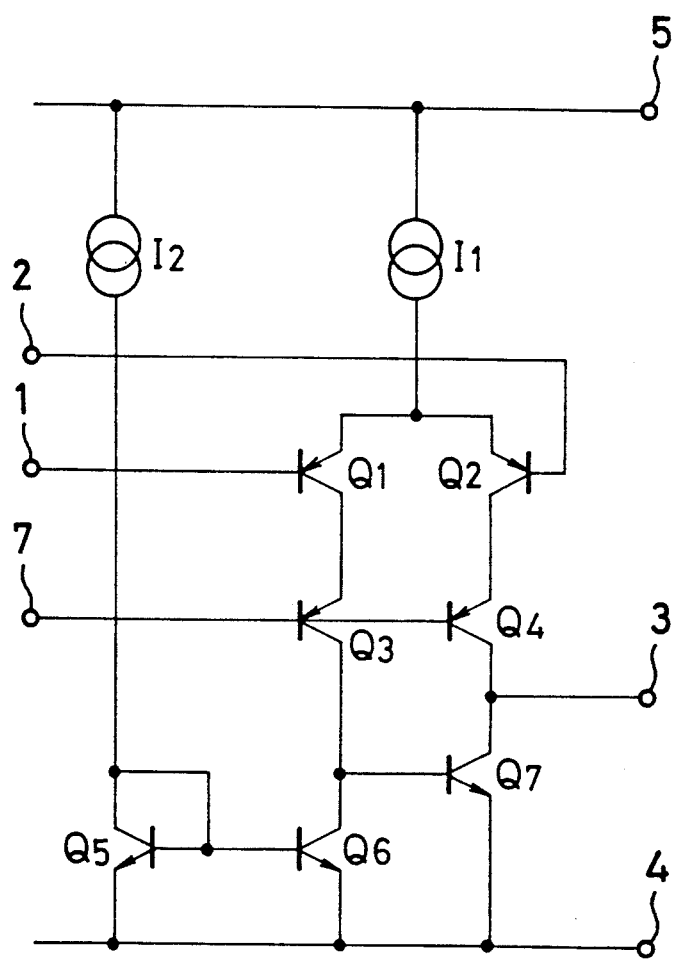
FIG. 11 is a schematic showing the tenth embodiment of the differential amplifier of this invention, wherein the polarity of each of the elements shown in FIG. 10 is changed.

FIG. 11 shows a schematic of the tenth embodiment of the differential amplifier of this invention. In this diagram the same marks as the ninth embodiment shown in FIG. 10 show like parts or equivalents. It differs from the ninth embodiment in that the polarities of the bipolar transistors $Q_1$–$Q_7$ and the constant-current sources $I_1$ and $I_2$ are reversed.

The fundamental operation of this embodiment as a differential amplifier is similar to that of the ninth embodiment since only the polarity of the circuit is reversed. Hence, we will omit explaining this embodiment in detail. As, in general, the noise of PNP transistors is smaller than that of NPN transistors, the use of PNP bipolar transistors $Q_1$, $Q_2$ as a pair of differential transistors in the singnal input part of this embodiment makes it possible to further improve the overall noise characteristics of the differential amplifier as compared with the ninth embodiment.

As is clear from the foregoing explanation, each of all the elements of this invention including the two constant-current sources, the current-mirror circuit, the pair of differential transistors, the amplifying transistor, to which output terminal is connected, and the grounded base transistors or grounded gate transistors constituting this invention can be constituted by using various kinds of transistors so that the differential amplifier of this invention can be constituted by arbitrarily combining such transistors.

The claimed invention is:

1. A differential amplifier comprising
    a first constant-current source one end of which is connected to a first power supply terminal,
    a current-mirror circuit having a first and a second transistors each of which has three electrodes, wherein in the first transistor the first electrode is connected to a second power supply terminal, the second electrode is connected to the third electrode, and the connection point common to the second and the third electrode is connected to the other end of the first constant-current source, and wherein in the second transistor the first electrode is connected to the second power supply terminal and the third electrode is connected to the common connection point,
    a second constant-current source one end of which is connected to the first power supply terminal,
    a pair of differential transistors consisting of a third transistor and a fourth transistor each of which has three electrodes, wherein in the third transistor the second electrode is connected to the second electrode of the second transistor and the third electrode is connected to a first signal input terminal, and wherein in the fourth transistor the first electrode is connected to the first electrode of the third transistor, the connection point common thereto is connected to the other end of the second constant-current source, and the third electrode is connected to a second signal input terminal, and
    a fifth transistor having three electrodes wherein the first electrode is connected to the second power supply terminal, the second electrode is connected to the second electrode of the fourth transistor, the connection point common thereto is connected to a signal output terminal, and the third electrode is connected to the second electrode of the second transistor.

2. The differential amplifier of claim 1, wherein each of the first and second constant-current sources is constituted by an FET wherein the gate is connected to a bias voltage terminal, the source is connected to said one end, and the drain is connected to said other end.

3. The differential amplifier of claim 1, wherein each of the first and second constant-current sources is constituted by a bipolar transistor wherein the base is connected to a bias voltage terminal, the emitter is connected to a resistor that is said one end, and the drain is connected to said other end.

4. The differential amplifier of claim 1, wherein each of the first, the second, and the fifth transistors is constituted by an FET having the source, the drain, and the gate as the first electrode, the second electrode, and the third electrode, respectively.

5. The differential amplifier of claim 1, wherein each of the first, the second, and the fifth transistors is constituted by a bipolar transistor having the emitter, the collector, and the base as the first electrode, the second electrode, and the third electrode, respectively.

6. A differential amplifier comprising
a first constant-current source one end of which is connected to a first power supply terminal,
a current-mirror circuit consisting of a first and a second transistors each of which has three electrodes wherein in the first transistor the first electrode is connected to a second power supply terminal, the second electrode is connected to the third electrode, and the connection point common to the second and the third electrodes is connected to the other end of the first constant-current source, and wherein in the second transistor the first electrode is connected to the second power supply terminal and the third electrode is connected to the common connection point,
a second constant-current source one end of which is connected to the first power supply terminal,
a pair of differential transistors consisting of a third transistor and a fourth transistor each of which has three electrodes wherein in the third transistor the third electrode is connected to a first signal input terminal, and wherein in the fourth transistor the first electrode is connected to the first electrode of the third transistor, the connection point common thereto is connected to the other end of the second constant-current source, and the third electrode is connected to a second signal input terminal,
a fifth transistor having three electrodes wherein the first electrode is connected to the second electrode of the third transistor, the second electrode is connected to the second electrode of the second transistor, and the third electrode is connected to the bias voltage terminal,
a sixth transistor having three electrodes wherein the first electrode is connected to the second electrode of the fourth transistor and the third electrode is connected to the bias voltage terminal, and
a seventh transistor having three electroded wherein the first electrode is connected to the second terminal, the second electrode is connected to the second electrode of the sixth transistor, the connection point common thereto is connected to a signal output terminal, and the third electrode is connected to the second electrode of the second transistor.

7. The differential amplifier of claim 6, wherein each of the first and the second constant-current sources is constituted by an FET wherein the gate is connected to a bias voltage terminal, the source is connected to said one end, and the drain is connected to said other end.

8. The differential amplifier of claim 6, wherein each of the first and second constant-current sources is constituted by a bipolar transistor wherein the base is connected to a bias voltage terminal, the emitter is connected to a resistor that is said one end, and the drain is connected to said other end.

9. The differential amplifier of claim 6, wherein each of the third and the fourth transistors is constituted by an FET having the source, the drain, and the gate as the first electrode, the second electrode, and the third electrode, respectively.

10. The differential amplifier of claim 6, wherein each of the third and the fourth transistors is constituted by a bipolar transistor having the emitter, the collector, and the base as the first electrode, the second electrode, and the third electrode, respectively.

11. The differential amplifier of claim 6, wherein each of the fifth and sixth transistors is constituted by an FET having the source, the drain, and the gate as the first electrode, the second electrode, and the third electrode, respectively.

12. The differential amplifier of claim 6, wherein each of the fifth and sixth transistors is constituted by a bipolar transistor having the emitter, the collector, and the base as the first electrode, the second electrode, and the third electrode, respectively.

13. The differential amplifier of claim 6, wherein each of the first, the second, and the seventh transistors is constituted by an FET having the source, the drain, and the gate as the first electrode, the second electrode, and the third electrode, respectively.

14. The differential amplifier of claim 6, wherein each of the first, the second, and the seventh transistors is constituted by a bipolar transistor having the emitter, the collector, and the base as the first electrode, the second electrode, and the third electrode, respectively.

* * * * *